(12) United States Patent
Miura

(10) Patent No.: US 12,301,178 B2
(45) Date of Patent: May 13, 2025

(54) BIAS CIRCUIT, AMPLIFIER, AND BIAS VOLTAGE CONTROLLING METHOD

(71) Applicant: NEC Corporation, Tokyo (JP)

(72) Inventor: Takuma Miura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 578 days.

(21) Appl. No.: 17/640,590

(22) PCT Filed: Jun. 11, 2020

(86) PCT No.: PCT/JP2020/022942
§ 371 (c)(1),
(2) Date: Mar. 4, 2022

(87) PCT Pub. No.: WO2021/049113
PCT Pub. Date: Mar. 18, 2021

(65) Prior Publication Data
US 2022/0352856 A1    Nov. 3, 2022

(30) Foreign Application Priority Data
Sep. 9, 2019   (JP) .................................. 2019-163718

(51) Int. Cl.
*H03F 3/19*    (2006.01)
(52) U.S. Cl.
CPC ..................... *H03F 3/19* (2013.01)
(58) Field of Classification Search
CPC ....................................................... H03F 3/19
USPC ........................................................ 330/296
See application file for complete search history.

(56) References Cited

U.S. PATENT DOCUMENTS

| 5,903,854 | A  |   | 5/1999  | Abe et al. |
|---|---|---|---|---|
| 2011/0090010 | A1 | * | 4/2011 | Oyabu ................. H03G 3/3036 |
|   |   |   |   | 330/284 |
| 2018/0026619 | A1 |   | 1/2018 | Murao et al. |
| 2019/0393840 | A1 |   | 12/2019 | Tango et al. |
| 2020/0186101 | A1 | * | 6/2020 | Chen ....................... H03F 3/211 |

FOREIGN PATENT DOCUMENTS

| JP | H08-307159 A | 11/1996 |
|---|---|---|
| WO | 2016/125424 A1 | 8/2016 |
| WO | 2018/154659 A1 | 8/2018 |

OTHER PUBLICATIONS

International Search Report for PCT Application No. PCT/JP2020/022942, mailed on Sep. 8, 2020.

* cited by examiner

*Primary Examiner* — Hafizur Rahman

(57) ABSTRACT

A bias circuit according to an example embodiment includes a first power source configured to generate a first gate voltage that puts an amplifying transistor in an on state; a voltage generating circuit configured to generate a second gate voltage by use of the first gate voltage input from the first power source, the second gate voltage putting the amplifying transistor in an off state; a first switching circuit configured to switch between the first gate voltage input to a first input terminal and the second gate voltage input to a second input terminal and to output the first gate voltage or the second gate voltage, based on a changeover signal related to on/off control of the amplifying transistor; and a voltage output terminal configured to output the gate voltage output from the first switching circuit to the amplifying transistor.

8 Claims, 7 Drawing Sheets

BIAS CIRCUIT, AMPLIFIER, AND BIAS VOLTAGE CONTROLLING METHOD

This application is a National Stage Entry of PCT/JP2020/022942 filed on Jun. 11, 2020, the contents of all of which are incorporated herein by reference, in their entirety.

TECHNICAL FIELD

The present invention relates to bias circuits, amplifiers, and bias voltage controlling methods.

BACKGROUND ART

Wireless communication involving, for example, mobile phones may adopt time domain duplexing (TDD), where uplink communication and downlink communication are switched therebetween by time division within the same frequency band. A transistor in an amplifier used in TDD is controlled to stay in an on state during transmission in order to amplify transmission signals. During reception, noise leaking into the reception system from the transmission system needs to be suppressed in order to improve the reception sensitivity. Therefore, during reception, the transistor in the amplifier is controlled to stay in an off state in order to keep any transmission signals from being output.

In one method of controlling the on/off of a transistor, a set voltage that puts the transistor in an on state and a pinch-off voltage that puts the transistor in an off state are prepared, and these voltages are switched therebetween by a switch, and one of these voltages is applied to the gate of the transistor.

Patent Literature 1 discloses a bias circuit that supplies a gate voltage for controlling the on/off of an amplifier. This circuit includes a first power source and a second power source. The first power source outputs a voltage necessary for a first gate voltage that puts an amplifier in an on state. The second power source outputs a voltage necessary for a second gate voltage that puts the amplifier in an off state. A changeover switch is provided between the first power source and the amplifier. When the changeover switch is in a short-circuited state, the first power source and the second power source are both connected to the amplifier, and the first gate voltage is supplied to the amplifier. When the changeover switch is open, only the second power source is connected to the amplifier, and the second gate voltage is supplied to the amplifier.

Meanwhile, Patent Literature 2 discloses a gate bias circuit that supplies a gate voltage to the gate terminal of an amplifying transistor. This circuit includes a first power source and a second power source. The first power source generates a first gate voltage to be applied to the gate terminal to turn on the amplifying transistor. The second power source generates a second gate voltage to be applied to the gate terminal to turn off the amplifying transistor. A switching circuit is provided between the amplifying transistor and the first and second power sources, and operating the switching circuit allows either the first gate voltage or the second gate voltage to be output to the amplifying transistor.

CITATION LIST

Patent Literature

Patent Literature 1: International Patent Publication No. WO2018/154659

Patent Literature 2: International Patent Publication No. WO2016/125424

SUMMARY OF INVENTION

According to the methods described above, the set voltage that puts a transistor in an on state needs to be set individually in accordance with a variation among transistors. Meanwhile, the pinch-off voltage can be either set individually or set to a voltage that guarantees pinch-off while taking a variation among transistors into consideration.

The techniques disclosed in Patent Literature 1 and 2 both require two power sources in order to generate a set voltage and a pinch-off voltage. Meanwhile, the method in which the pinch-off voltage is set in consideration of a variation among transistors has shortcomings in that the high-frequency characteristics become degraded due to a gate lag caused by a large potential difference between the gate and the drain at pinch-off.

In view of the shortcomings described above, the present disclosure is directed to providing a bias circuit, an amplifier, and a bias voltage controlling method that can suppress degradation of high-frequency characteristics associated with a gate lag caused by a large potential difference between the gate and the drain at pinch-off.

A bias circuit according to a first aspect of the present invention includes a first power source, a voltage generating circuit, a first switching circuit, and a voltage output terminal. The first power source is configured to generate a first gate voltage that puts an amplifying transistor in an on state. The voltage generating circuit is configured to generate a second gate voltage by use of the first gate voltage input from the first power source, and the second gate voltage puts the amplifying transistor in an off state. The first switching circuit is configured to switch between the first gate voltage input to a first input terminal and the second gate voltage input to a second input terminal and to output the first gate voltage or the second gate voltage, based on a changeover signal related to on/off control of the amplifying transistor. The voltage output terminal is configured to output the gate voltage output from the first switching circuit to the amplifying transistor.

A bias voltage controlling method according to a second aspect of the present invention includes generating a first gate voltage that puts an amplifying transistor in an on state; generating a second gate voltage by use of the first gate voltage, the second gate voltage putting the amplifying transistor in an off state; and switching between the first gate voltage input to a first input terminal and the second gate voltage input to a second input terminal and outputting the first gate voltage or the second gate voltage to the amplifying transistor, based on a changeover signal related to on/off control of the amplifying transistor.

The present invention can provide a bias circuit, an amplifier, and a bias voltage controlling method that can suppress degradation of high-frequency characteristics associated with a gate lag caused by a large potential difference between the gate and the drain at pinch-off.

DESCRIPTION OF EMBODIMENTS

Hereinafter, some example embodiments of the present invention will be described with reference to the drawings. In the following description and drawings, omissions and simplifications are made, as appropriate, to make the description and the drawings clearer.

An example embodiment relates to a technique for controlling a gate voltage of an amplifying transistor in an amplifier for use in a communication device. A bias circuit according to an example embodiment includes a first power source, a voltage generating circuit, a first switching circuit, and a voltage output terminal. The first power source is configured to generate a first gate voltage that puts an amplifying transistor in an on state. The voltage generating circuit is configured to generate a second gate voltage by use of the first gate voltage input from the first power source, and the second gate voltage puts the amplifying transistor in an off state. The first switching circuit is configured to switch between the first gate voltage input to a first input terminal and the second gate voltage input to a second input terminal and to output the first gate voltage or the second gate voltage, based on a changeover signal related to on/off control of the amplifying transistor. The voltage output terminal is configured to output the gate voltage output from the first switching circuit to the amplifying transistor.

According to the example embodiment, a pinch-off voltage that turns the amplifying transistor off and that corresponds to a set voltage for turning the amplifying transistor on can be applied to the amplifying transistor without any influence of a variation in the performance among amplifying transistors. This can reduce the potential difference between the gate and the drain and prevent degradation of high-frequency characteristics associated with a gate lag.

First Example Embodiment

Figure 1:
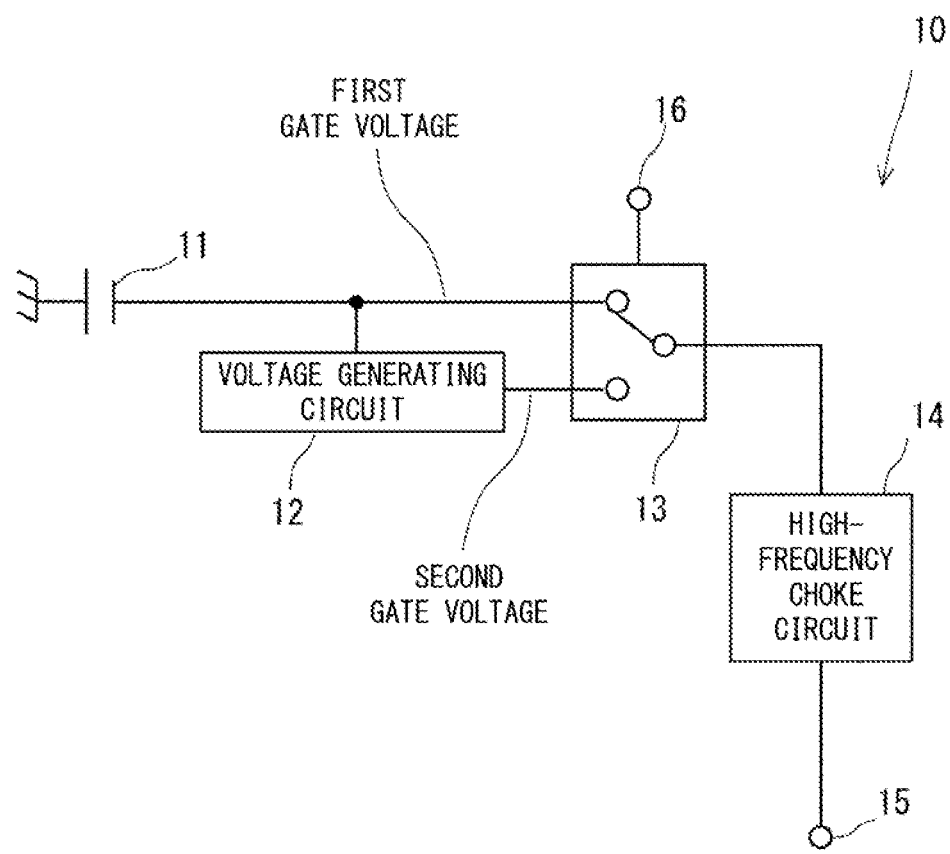
FIG. 1 illustrates a configuration of a bias circuit according to a first example embodiment.

FIG. 1 illustrates a configuration of a bias circuit 10 according to a first example embodiment. As illustrated in FIG. 1, the bias circuit 10 includes a first power source 11, a voltage generating circuit 12, a first switching circuit 13, a high-frequency choke circuit 14, a voltage output terminal 15, and a changeover signal input terminal 16. This bias circuit 10 is applied, for example, to an amplifier of a time domain duplexing (TDD) communication device, where uplink communication and downlink communication are switched therebetween by time division within the same frequency band. The voltage output terminal 15 of the bias circuit 10 outputs a gate voltage, and this gate voltage is supplied to the gate of an amplifying transistor.

The first power source 11 generates a first gate voltage that puts the amplifying transistor in an on state. By use of the first gate voltage input from the first power source 11, the voltage generating circuit 12 generates a second gate voltage that puts the amplifying transistor in an off state. In other words, according to the first example embodiment, only the first power source 11 is provided, and a first gate voltage generated by the first power source 11 is used to generate a second gate voltage.

The first switching circuit 13 is a single-pole double-throw (SPDT) switching circuit. The first switching circuit 13 includes a first input terminal 13a, a second input terminal 13b, and an output terminal 13c. A first gate voltage is input to the first input terminal 13a. A second gate voltage is input to the second input terminal 13b.

The output terminal 13c becomes connected to either of the first input terminal 13a and the second input terminal 13b. A changeover signal related to the on/off control of the amplifying transistor is input to the changeover signal input terminal 16 and then supplied to the first switching circuit 13. Based on this changeover signal, the first switching circuit 13 switches the connection of the output terminal 13c to either the first input terminal 13a or the second input terminal 13b and outputs either a first gate voltage or a second gate voltage.

The voltage output terminal 15 outputs a gate voltage input from the first switching circuit 13 to an external amplifying transistor. The high-frequency choke circuit 14 is provided between the first switching circuit 13 and the voltage output terminal 15. The high-frequency choke circuit 14 keeps high-frequency signals from the amplifying transistor from entering the bias circuit 10.

Figure 2:
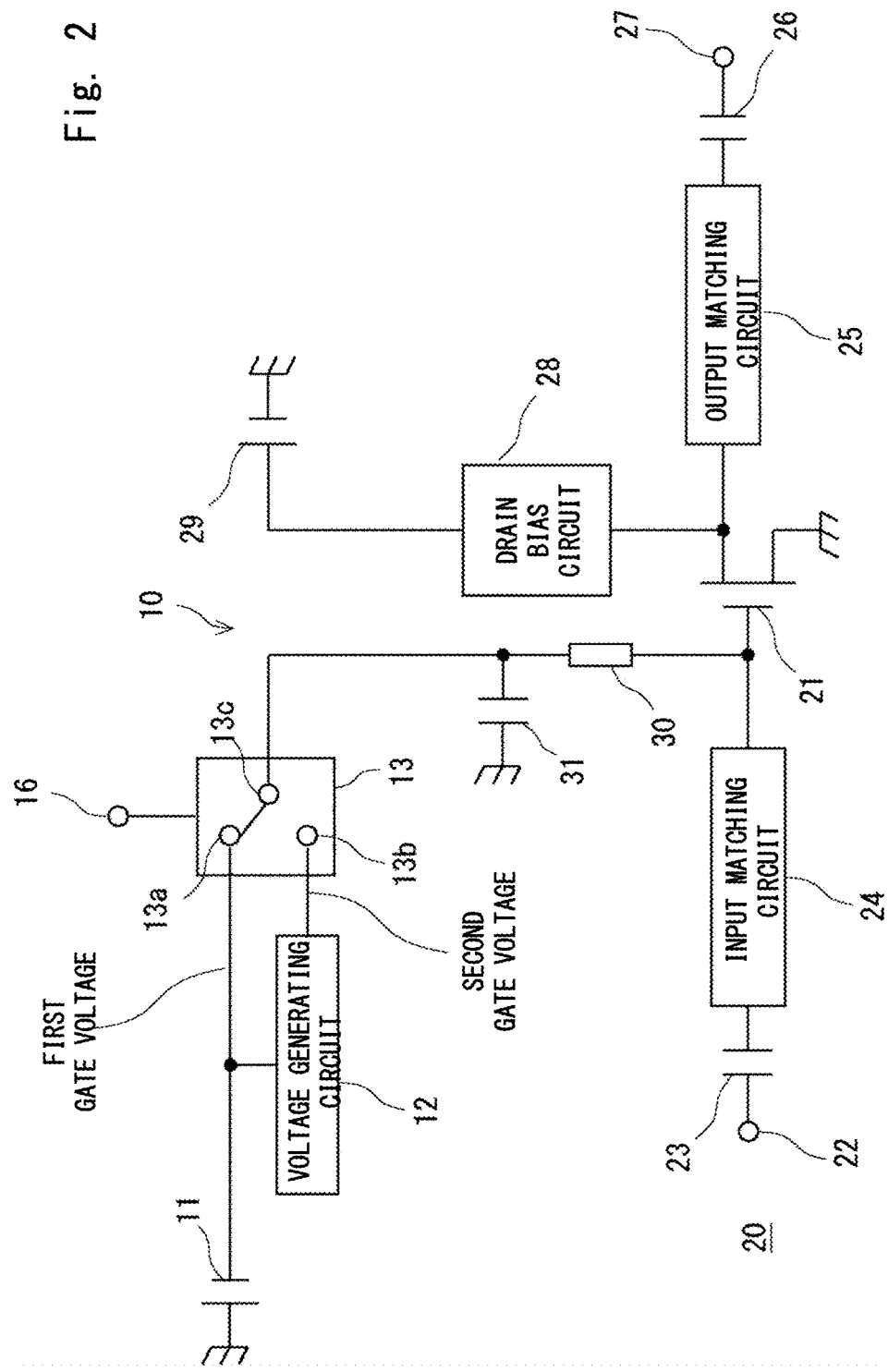
FIG. 2 illustrates a configuration of an amplifier that includes the bias circuit according to the first example embodiment.

FIG. 2 illustrates an example in which the bias circuit 10 is applied to an amplifier 20 provided in a communication device. As illustrated in FIG. 2, the amplifier 20 includes the bias circuit 10, an amplifying transistor 21, a high-frequency signal input terminal 22, a capacitor 23, an input matching circuit 24, an output matching circuit 25, a capacitor 26, a high-frequency signal output terminal 27, a drain bias circuit 28, and a power source 29. In the example illustrated in FIG. 2, the high-frequency choke circuit 14 illustrated in FIG. 1 is constituted by a λ/4 transmission line 30 and a shunt capacitor 31. The voltage output terminal 15 of the bias circuit 10 is connected to the gate terminal of the amplifying transistor 21.

While the λ/4 transmission line 30 is used as a transmission line between the first switching circuit 13 and the voltage output terminal 15 in the example illustrated in FIG. 2, any transmission line of a line length corresponding to the wavelength of the signal to be amplified by the amplifying transistor 21 may be used. For the high-frequency choke circuit 14, it suffices that its impedance seen from the voltage output terminal 15 be a desired high impedance in the frequency band of high-frequency signals, and the line length of the transmission line need not be λ/4 of the wavelength of the signal to be amplified.

A first gate voltage generated by the first power source 11 is the voltage to be applied to the gate terminal of the amplifying transistor 21 while high-frequency signals are output from the high-frequency signal output terminal 27. In other words, a first gate voltage is a set voltage that puts the amplifying transistor 21 in an on state.

The voltage generating circuit 12 generates a second gate voltage by performing a predetermined calculation on an input first gate voltage. A second gate voltage generated by the voltage generating circuit 12 is the voltage to be applied to the gate terminal of the amplifying transistor 21 while no high-frequency signal is output from the high-frequency signal output terminal 27. In other words, a second gate voltage is a pinch-off voltage that puts the amplifying transistor 21 in an off state.

A changeover signal for switching on or off the amplifying transistor 21 is input to the changeover signal input terminal 16. Based on the changeover signal, the first switching circuit 13 selects either a first gate voltage or a second gate voltage. The voltage applied to the gate of the amplifying transistor 21 is either a first gate voltage input to the first input terminal 13a of the first switching circuit 13 or a second gate voltage applied to the second input terminal 13b.

A changeover signal switches on or off the amplifying transistor 21 at a timing matching the switching from transmission to reception in time domain duplexing (TDD). Based on this changeover signal, the first switching circuit 13 switches from a first gate voltage to a second gate voltage and outputs the second gate voltage at a timing matching the switching from transmission to reception.

For the first switching circuit 13, the state in which the output terminal 13c is connected to the first input terminal 13a on the side of the first power source 11 is referred to as an on-period connection state, in which the amplifying transistor 21 is on. Meanwhile, the state in which the output terminal 13c is connected to the second input terminal 13b on the side of the voltage generating circuit 12 is referred to as an off-period connection state, in which the amplifying transistor 21 is off. FIG. 2 illustrates an on-period connection state, where a first gate voltage has been selected by the first switching circuit 13.

Figure 3:
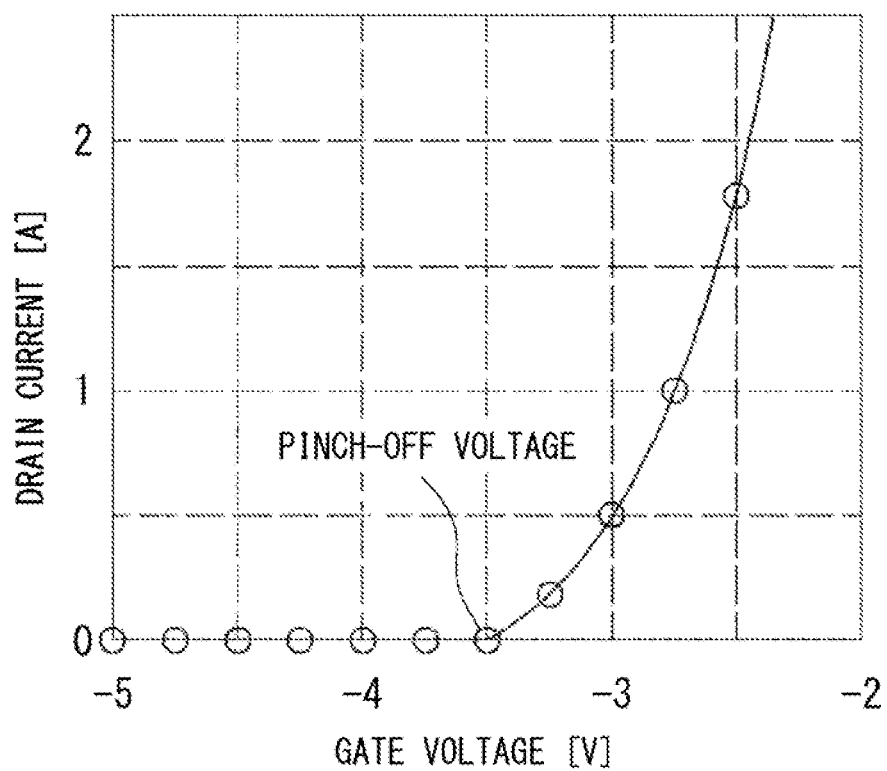
FIG. 3 is a graph illustrating characteristics of a drain current with respect to a gate voltage in an amplifying transistor.

Now, the gate voltage to be applied to the gate of the amplifying transistor 21 will be described. In this example, the amplifying transistor 21 is a depression-type field-effect transistor, for example. FIG. 3 is a graph illustrating a relationship between a gate voltage and a drain current in a depression-type field-effect transistor. In FIG. 3, the horizontal axis represents the gate voltage, and the vertical axis represents the drain current.

As illustrated in FIG. 3, no drain current flows when the gate voltage is lower than or equal to the pinch-off voltage. Once the gate voltage exceeds the pinch-off voltage, the drain current starts flowing and increases along with the rise in the gate voltage. Normally, to put the amplifying transistor 21 in an on state, the gate voltage is set to the value of a certain drain current (e.g., the drain current of 500 mA for the gate voltage of −3 V). Meanwhile, to put the amplifying transistor 21 in an off state, the gate voltage is set to a value that keeps the drain current from flowing (e.g., the gate voltage of −5 V).

In this manner, in the depression-type field-effect transistor, the gate voltage is at a negative polarity in both an on state and an off state, and the absolute value of the gate voltage is higher in an off state than in an on state. Therefore, the second gate voltage that puts the transistor in an off state can be calculated by subtracting a predetermined value (e.g., −2 V) from the first gate voltage that puts the transistor in an on state.

By use of the above, in the amplifier 20 illustrated in FIG. 2, a first gate voltage to be applied to the first input terminal 13a of the first switching circuit 13 is set so as to put the amplifying transistor 21 in an on state. Meanwhile, the voltage generating circuit 12 is designed to output a second gate voltage upon subtracting a predetermined value from the input first gate voltage so that this second gate voltage applied to the second input terminal 13b of the first switching circuit 13 puts the amplifying transistor 21 in an off state.

With this configuration, the second gate voltage that puts the amplifying transistor 21 in an off state can be determined only by setting the first gate voltage.

Figure 4:
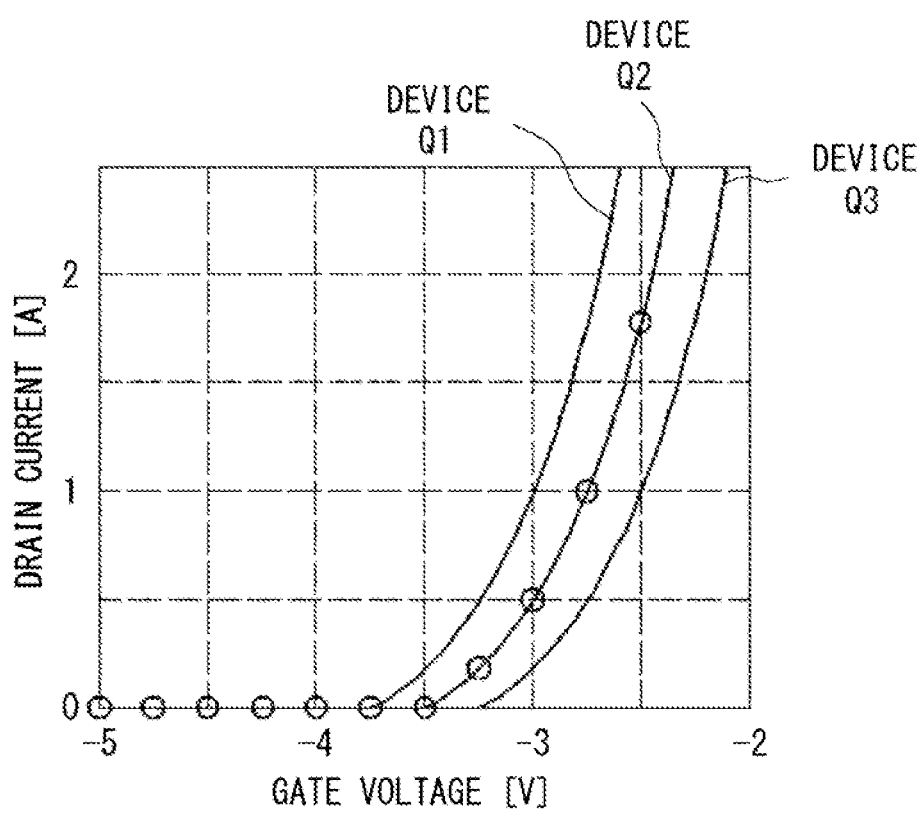
FIG. 4 is a graph illustrating a variation in the characteristics of drain currents with respect to a gate voltage in a depression-type amplifying transistor.

FIG. 4 is a graph illustrating a variation in the characteristics of drain currents with respect to a gate voltage among depression-type amplifying transistors. As illustrated in FIG. 4, the value of the gate voltage that puts a transistor in an on state varies among devices (Q1 to Q3). When the bias voltage controlling technique according to an example embodiment is not used, the value of the gate voltage that puts transistors in an off state needs to be set to a value that puts all the amplifying transistors 21 in an off state while taking a variation among the amplifying transistors 21 into consideration, and this results in a large absolute value of the gate voltage that puts the transistors in an off state. A large potential difference between the gate and the drain at pinch-off leads to degradation of high-frequency characteristics due to a gate lag. Moreover, in order to grasp the variation among the amplifying transistors 21, the characteristics such as those illustrated in FIG. 4 need to be measured multiple times.

The inventor has found that the voltage difference between the gate voltage that puts a transistor in an on state and the pinch-off voltage is constant and is not dependent on the variation among the devices (Q1 to Q3), as illustrated in FIG. 4. Hence, according to the example embodiment, a second gate voltage that puts an amplifying transistor 21 in an off state is generated by subtracting a predetermined value from a first gate voltage that puts the amplifying transistor 21 in an on state. This configuration can reduce the absolute value of the gate voltage that puts an amplifying transistor 21 in an off state and can thus prevent degradation of high-frequency characteristics associated with a gate lag caused by a large potential difference between the gate and the drain. In addition, the difference between the gate voltage that puts an amplifying transistor 21 in an on state and the pinch-off voltage, that is, the value to be subtracted from a first gate voltage in order to generate a second gate voltage can be obtained by measuring the characteristics illustrated in FIG. 4 only once.

Now, an operation of the amplifier 20 according to the first example embodiment will be described. First, an operation performed while high-frequency signals are output (on state) will be described. In this case, the output terminal 13c is connected to the first input terminal 13a in the first switching circuit 13. Therefore, a first gate voltage generated by the first power source 11 is applied to the gate terminal of the amplifying transistor 21 via the first switching circuit 13 and the λ/4 transmission line 30. The high-frequency signals are grounded to GND by the shunt capacitor 31 connected in parallel between the first switching circuit 13 and the λ/4 transmission line 30. Meanwhile, a drain voltage generated by the power source 29 is applied to the drain terminal of the amplifying transistor 21 via the drain bias circuit 28.

In this manner, while a drain voltage and a first gate voltage are applied to the amplifying transistor 21, a high-frequency signal input from the high-frequency signal input terminal 22 is input to the amplifying transistor 21 via the capacitor 23 and the input matching circuit 24. This high-frequency signal is amplified by the amplifying transistor 21 and then output from the high-frequency signal output terminal 27 via the output matching circuit 25 and the capacitor 26.

Next, an operation performed when no high-frequency signal is output (off state) will be described. In this case, the output terminal 13c is connected to the second input terminal 13b in the first switching circuit 13. Therefore, a second gate voltage generated by the voltage generating circuit 12 by use of a first gate voltage is applied to the gate terminal of the amplifying transistor 21. At this point, the amplifying transistor 21 is pinched off, and no high-frequency signal, even if input to the amplifying transistor 21, is amplified. In this example, no high-frequency signal needs to be input.

Next, an operation performed when the amplifying transistor 21 is switched on or off will be described. While the following describes an operation performed when the amplifying transistor 21 is switched from on to off, the description applies similarly even when this switching is reversed. First, based on a control signal that controls the amplifying transistor 21 from on to off, a changeover signal that switches the first switching circuit 13 from an on-period connection state to an off-period connection state is input to the changeover signal input terminal 16. This causes the connection of the output terminal 13c in the first switching circuit 13 to change from the first input terminal 13a to the second input terminal 13b. Thus, the output of the first switching circuit 13 changes from a first gate voltage to a second gate voltage.

As described above, according to the example embodiment, a set voltage and a pinch-off voltage generated through a calculation process of subtracting a predetermined value from the set voltage are switched therebetween by a switch in the bias circuit of the amplifying transistor, and thus the amplifying transistor 21 is switched on or off. This configuration makes it possible to generate a pinch-off voltage that corresponds to the set voltage for putting an amplifying transistor in an on state and that puts the amplifying transistor in an off state can be generated without any influence of a variation among amplifying transistors. Accordingly, the potential difference between the gate and the drain can be reduced, and this can prevent degradation of high-frequency characteristics associated with a gate lag.

Second Example Embodiment

Figure 5:
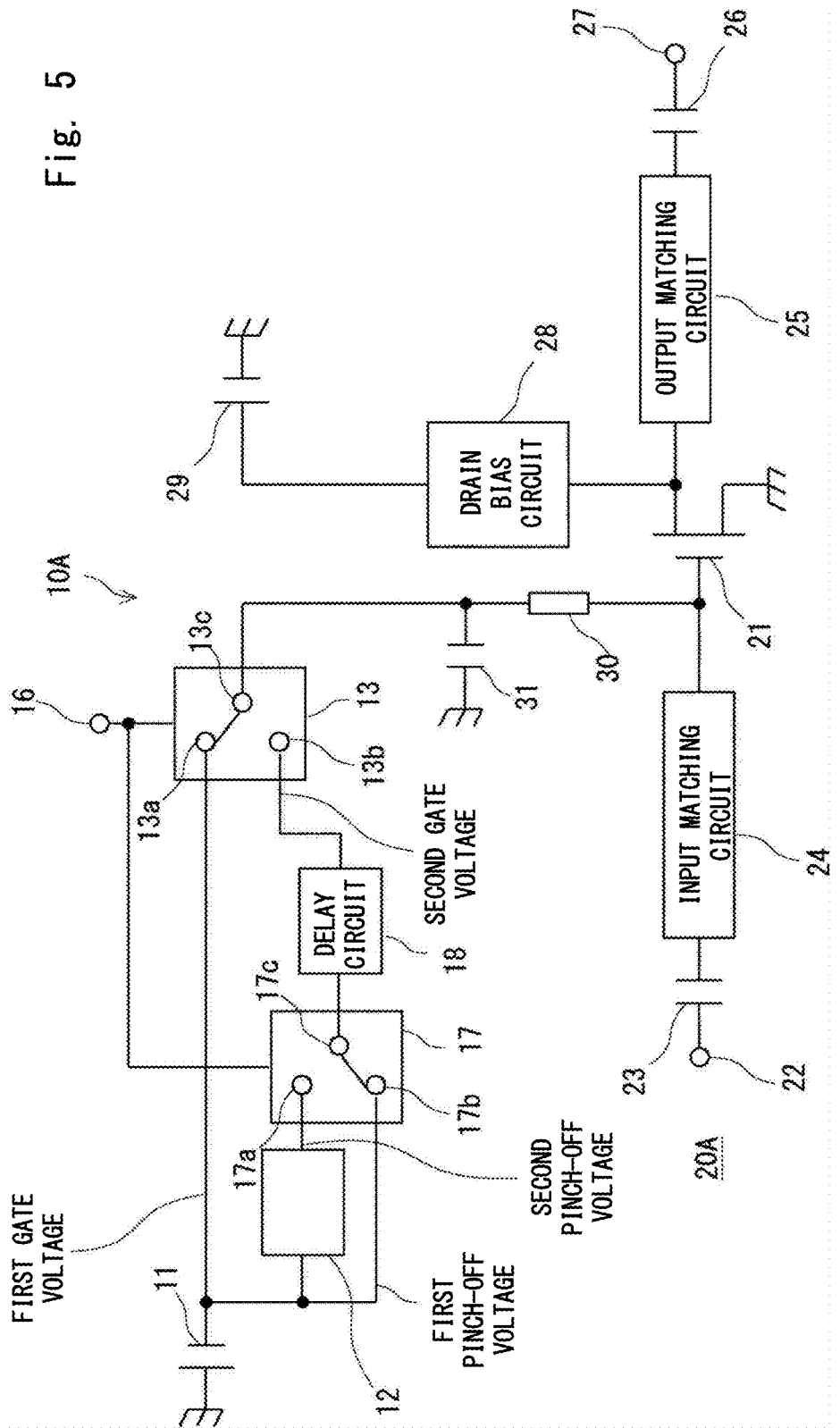
FIG. 5 illustrates a configuration of an amplifier that includes a bias circuit according to a second example embodiment.

FIG. 5 illustrates an example in which a bias circuit 10A according to a second example embodiment is applied to an amplifier 20A provided in a communication device. As illustrated in FIG. 5, the bias circuit 10A according to the second example embodiment includes a second switching circuit 17 and a delay circuit 18, in addition to the components of the bias circuit 10 illustrated in FIG. 2. The second switching circuit 17 and the delay circuit 18 are provided in series between an output terminal of the voltage generating circuit 12 and the second input terminal 13b of the first switching circuit 13.

As with the first switching circuit 13, the second switching circuit 17 is an SPDT switching circuit. The second switching circuit 17 includes a first input terminal 17a, a second input terminal 17b, and an output terminal 17c. In the example illustrated in FIG. 5, the voltage input to the first input terminal 17a is referred to as a second pinch-off voltage, and the voltage input to the second input terminal 17b is referred to as a first pinch-off voltage.

The first power source 11 generates a first gate voltage and outputs the generated first gate voltage to the second input terminal 17b as a first pinch-off voltage. In other words, a first pinch-off voltage is equal to a first gate voltage. The voltage generating circuit 12 generates a second gate voltage by use of an input first gate voltage and outputs the generated second gate voltage to the first input terminal 17a as a second pinch-off voltage. In other words, a second pinch-off voltage is equal to a second gate voltage.

The output terminal 17c becomes connected to either of the first input terminal 17a and the second input terminal 17b. A changeover signal input via the changeover signal input terminal 16 is supplied not only to the first switching circuit 13 but also to the second switching circuit 17. Based on this changeover signal, the second switching circuit 17 switches the connection of the output terminal 17c to either the first input terminal 17a or the second input terminal 17b and outputs either a first pinch-off voltage or a second pinch-off voltage. The delay circuit 18 is provided between the output terminal 17c and the second input terminal 13b. The delay circuit 18 adds a delay to a pinch-off voltage output from the second switching circuit 17 and outputs the resulting voltage to the second input terminal 13b as a second gate voltage.

As described above, for the first switching circuit 13, the state in which the output terminal 13c is connected to the first input terminal 13a on the side of the first power source 11 is an on-period connection state, and the state in which the output terminal 13c is connected to the second input terminal 13b on the side of the voltage generating circuit 12 is an off-period connection state. Meanwhile, for the second switching circuit 17, the state in which the output terminal 17c is connected to the second input terminal 17b is an on-period connection state, and the state in which the output terminal 17c is connected to the first input terminal 17a is an off-period connection state.

Accordingly, the second switching circuit 17 outputs a first pinch-off voltage to the second input terminal 13b via the delay circuit 18 when the first switching circuit 13 outputs a first gate voltage. Meanwhile, the second switching circuit 17 outputs a second pinch-off voltage to the second input terminal 13b via the delay circuit 18 when the first switching circuit 13 outputs a second gate voltage.

Figure 6:
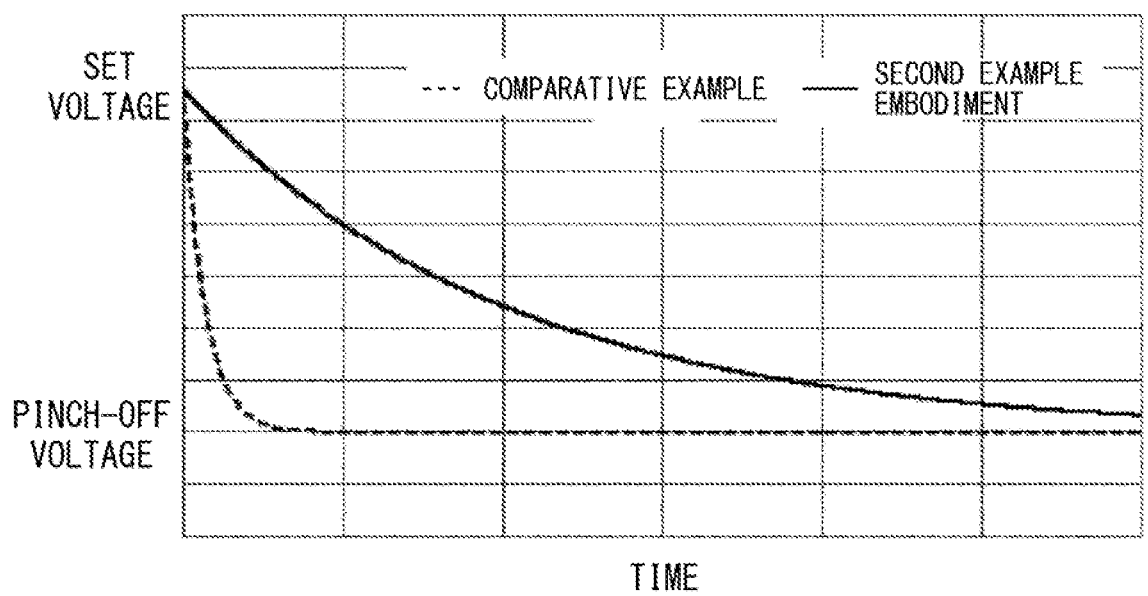
FIG. 6 illustrates a difference in the pinch-off voltage between the second example embodiment and a comparative example.

In an on-period connection state, there is no difference between the gate voltage of the amplifying transistor 21 illustrated in FIG. 2 and the gate voltage of the amplifying transistor 21 illustrated in FIG. 5. Thereafter, upon a shift to an off-period connection state, a voltage that has changed from a first pinch-off voltage to a second pinch-off voltage is input to the delay circuit 18, and the second pinch-off voltage is output as a second gate voltage. Accordingly, as illustrated in FIG. 6, the voltage that changes gently from the set voltage to the pinch-off voltage is applied to the gate of the amplifying transistor 21. This configuration makes it possible to change the potential difference between the gate and the drain gently and can thus prevent degradation of high-frequency characteristics associated with a gate lag.

Figure 7:
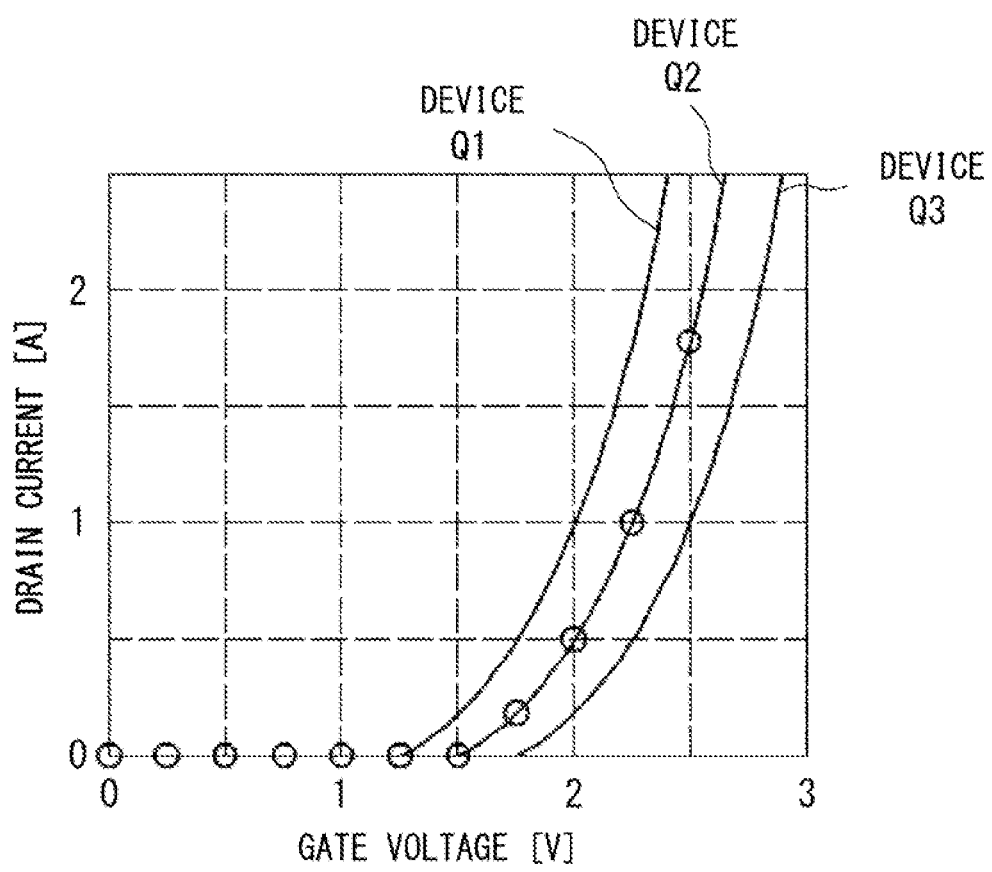
FIG. 7 is a graph illustrating a variation in the characteristics of drain currents with respect to a gate voltage in an enhancement-type amplifying transistor.

The present invention is not limited to the example embodiments described above, and modifications can be made, as appropriate, within the scope that does not depart from the technical spirit. A depression-type field-effect transistor is used as an amplifying transistor 21 according to the foregoing example embodiments, but this is not a limiting example. An enhancement-type field-effect transistor can also be used as an amplifying transistor 21. As illustrated in FIG. 7, in an enhancement-type field-effect transistor, the gate voltage is at a positive polarity in both an on state and an off state, and the absolute value of the gate voltage is higher in an on state than in an off state. Therefore, even when an enhancement-type field-effect transistor is used, as in the foregoing example embodiments, a second gate voltage that puts an amplifying transistor 21 in an off state can be calculated by subtracting a predetermined value from a first gate voltage that puts the amplifying transistor 21 in an on state. The example embodiments can be used favorably in a microwave electronic circuit that includes a transistor.

Thus far, the invention of the present application has been described with reference to the example embodiments, but the invention of the present application is not limited by the foregoing example embodiments. Various modifications that a person skilled in the art can appreciate can be made to the configurations and the details of the invention of the present application within the scope of the invention.

This application claims priority to Japanese Patent Application No. 2019-163718, filed on Sep. 9, 2019, the entire disclosure of which is incorporated herein.

REFERENCE SIGNS LIST 10 bias circuit
10A bias circuit
11 first power source
12 voltage generating circuit
13 first switching circuit
13a first input terminal
13b second input terminal
13c output terminal
14 high-frequency choke circuit
15 voltage output terminal
16 changeover signal input terminal
17 second switching circuit
17a first input terminal
17b second input terminal
17c output terminal
18 delay circuit
20 amplifier
21 amplifying transistor
22 high-frequency signal input terminal
23 capacitor
24 input matching circuit
25 output matching circuit
26 capacitor
27 high-frequency signal output terminal
28 drain bias circuit
29 power source
30 λ/4 transmission line
31 shunt capacitor

What is claimed is:

1. A bias circuit comprising:
a first power source configured to generate a first gate voltage that puts an amplifying transistor in an on state;
a voltage generating circuit configured to generate a second gate voltage by use of the first gate voltage input from the first power source, the second gate voltage putting the amplifying transistor in an off state;
a first switching circuit configured to switch between the first gate voltage input to a first input terminal and the second gate voltage input to a second input terminal and to output the first gate voltage or the second gate voltage, based on a changeover signal related to on/off control of the amplifying transistor;
a voltage output terminal configured to output the gate voltage output from the first switching circuit to the amplifying transistor; and
a second switching circuit provided between an output terminal of the voltage generating circuit and the second input terminal of the first switching circuit, the second switching circuit configured to switch between a first pinch-off voltage equal to the first gate voltage and a second pinch-off voltage equal to the second gate voltage and to output the first pinch-off voltage or the second pinch-off voltage, based on the changeover signal; and
a delay circuit provided between an output terminal of the second switching circuit and the second input terminal of the first switching circuit.

2. The bias circuit according to claim 1, wherein
the amplifying transistor is a field-effect transistor whose on/off is controlled by the first gate voltage and the second gate voltage of the same polarity, and
the voltage generating circuit is configured to calculate the second gate voltage by subtracting a predetermined value from the first gate voltage.

3. The bias circuit according to claim 1, wherein the first switching circuit is configured to switch from the first gate voltage to the second gate voltage at a timing that matches a timing of switching from transmission to reception in time domain duplexing (TDD).

4. A bias voltage controlling method comprising:
generating a first gate voltage that puts an amplifying transistor in an on state;
generating a second gate voltage by use of the first gate voltage, the second gate voltage putting the amplifying transistor in an off state;
switching between the first gate voltage input to a first input terminal and the second gate voltage input to a second input terminal and outputting the first gate voltage or the second gate voltage to the amplifying transistor, based on a changeover signal related to on/off control of the amplifying transistor; and
outputting a first pinch-off voltage equal to the first gate voltage to the second input terminal via a delay circuit when the first gate voltage is outputted; and
outputting a second pinch-off voltage equal to the second gate voltage to the second input terminal via the delay circuit when the second gate voltage is outputted.

5. The bias circuit according to claim 1, wherein the second switching circuit is configured to
output the first pinch-off voltage to the second input terminal via the delay circuit when the first switching circuit outputs the first gate voltage, and
output the second pinch-off voltage to the second input terminal via the delay circuit when the first switching circuit outputs the second gate voltage.

6. An amplifier comprising:
the bias circuit according to claim 1; and
the amplifying transistor to which the gate voltage output from the voltage output terminal of the bias circuit is supplied.

7. The bias voltage controlling method according to claim 4, wherein the first gate voltage is switched to the second gate voltage at a timing that matches a timing of switching from transmission to reception in time domain duplexing (TDD).

8. The bias voltage controlling method according to claim 4, wherein
the amplifying transistor is a field-effect transistor whose on/off is controlled by the first gate voltage and the second gate voltage of the same polarity, and
the second gate voltage is calculated by subtracting a predetermined value from the first gate voltage.

* * * * *